United States Patent [19]

Hsu

[11] Patent Number: 5,448,094
[45] Date of Patent: Sep. 5, 1995

[54] CONCAVE CHANNEL MOS TRANSISTOR AND METHOD OF FABRICATING THE SAME

[75] Inventor: Chen-Chung Hsu, Taichung, Taiwan

[73] Assignee: United Microelectronics Corp., Hsinchu City, Taiwan

[21] Appl. No.: 294,568

[22] Filed: Aug. 23, 1994

[51] Int. Cl.$^6$ .................... H01L 29/68; H01L 21/265
[52] U.S. Cl. ...................... 257/330; 257/332; 257/335; 257/401; 257/408; 257/412; 257/622; 437/40; 437/44; 437/228; 437/233; 437/235
[58] Field of Search ............... 257/330, 332, 335, 401, 257/408, 622, 412; 437/40, 44, 228, 235, 233

[56] References Cited

U.S. PATENT DOCUMENTS 5,105,242  4/1992  Fujihiar et al. ............ 257/284
5,142,640  8/1992  Iwamatsu .................. 257/332

Primary Examiner—Edward Wojciechowicz
Attorney, Agent, or Firm—Ladas & Parry

[57] ABSTRACT

A MOS transistor with concave channel and method of fabrication is provided. First, a LOCOS procedure is performed to form a field oxide layer on a silicon substrate by using a barrier layer as a mask. Next, the field oxide is removed to leave a concave area in the silicon substrate. Silicon dioxide sidewall spacers are formed apart on side walls of the barrier layer. A gate oxide layer is formed on the bottom of the concave area. A polysilicon layer is formed in conformity with the exposed surfaces of the barrier layer, the silicon dioxide sidewall spacers, and the gate oxide layer. A mask layer is formed overlying the polysilicon layer within the concave area. Then, portions of the polysilicon layer not covered by the mask layer are removed, so that the remained portion of the polysilicon layer and the gate oxide layer together construct a gate electrode, while the area under the gate electrode forms a concave channel. The mask layer and the barrier layer are removed respectively. Heavily doped source/drain areas are formed by a first ion implantation using the gate electrode and the silicon dioxide sidewall spacers as self-align masks. After removing the silicon dioxide sidewall spacers, lightly doped source/drain areas are formed by a second ion implantation using the gate electrode as a self-align mask.

10 Claims, 5 Drawing Sheets

CONCAVE CHANNEL MOS TRANSISTOR AND METHOD OF FABRICATING THE SAME

BACKGROUND OF THE INVENTION

1. Field of the Invention

This invention relates to the manufacture of integrated circuit (IC) devices, and more particularly to a concave channel MOS transistor and a method of fabrication by self-aligned process technology.

2. Description of the Prior Art

With the continued reduction of the size of semiconductor devices, MOS transistor devices having a short channel configuration are widely utilized, and consequently an important aspect of IC design. However, a device having short channel fabricated by conventional process technology has the following drawbacks: (1) hot carrier effects, (2) high leakage current, and (3) sub threshold voltage, all of which will reduce the lifetime of device. Hence, new techniques have been needed that fabricate devices with a substantially short channel configuration, but without the above mentioned drawbacks.

One prior art device that addresses these problem is the "concave channel" MOS transistor. A field oxide layer is first formed by LOCal Oxidation of Silicon (LOCOS) on a substrate, next the field oxide layer is removed to leave a concave area in the substrate. Then a concave channel is formed on the concave area, which will increase the effective channel length resolving hot carrier, leakage current, and sub threshold problems. Referring to FIGS. 1A to 1D, the process steps of a prior art MOS transistor with concave channel is described in detailed as follows.

First, as shown in FIG. 1A, a LOCOS process is performed. For example, a pad oxide layer 11 and a silicon nitride layer 12 are deposited on a P type silicon substrate 10. The pad oxide layer 11 and the silicon nitride layer 12 are patterned to form an opening 13 by conventional lithography and etching processes. A filed oxide layer 14 is formed on portion of the silicon substrate 10 within the opening 13 by thermal oxidation.

Next, as shown in FIG. 1B, the silicon nitride layer 12 is etched away in a hot phosphoric acid solution. N type impurities, such as arsenic ions, are implanted into silicon substrate 10 to form heavily doped N+ source/drain areas 15, using the field oxide layer 14 as a mask.

Referring to FIG. 1C, the field oxide layer 14 is removed by etching, so as to leave a concave area in the silicon substrate 10. A gate oxide layer 16 is formed on the bottom of the concave area by thermal oxidation or chemical vapor deposition (CVD). A polysilicon layer 17 is deposited overlying the pad oxide layer 11 and gate oxide layer 16. A photoresist layer 18 is coated and patterned on the surface of polysilicon layer 17 to act as a mask.

Then, as shown in FIG. 1D, those portions of the polysilicon layer 17 not covered by the photoresist layer 18 are removed, preferably by reactive ion etching (RIE). The remaining portion of the polysilicon layer 17 forms a polysilicon gate layer 17a. The pad oxide layer 11 is removed preferably by RIE using the photoresist layer 18 as a mask to expose the heavily doped N+ source/drain areas 15. Finally, after removing the photoresist layer 18, an insulating layer with metal contact via, such as a borophosphosilicate (BPSG) layer 19, is formed on the silicon substrate 10 completing the fabricating of a prior art MOS transistor.

A concave channel is formed in that portion of the silicon substrate 10 disposed under the polysilicon gate layer 17a and between the heavily doped N+ source/drain areas 15. Thus the effective channel length of the MOS transistor is increased without increasing device size, which helps to prevent problems due to the hot carrier effect, leakage current, etc., mentioned previously However, two photomasks are used in the prior art technique: one to define the field oxide layer 14 and another is to define the polysilicon gate layer 17a. As the size of devices reduces, it becomes ever more difficult to define patterns precisely by lithographic processes on a non-uniform substrate. Hence there is a need to use as few photomasks as possible in order to simplify device manufacture and realize smaller devices.

SUMMARY OF THE INVENTION

It is therefore an object of the present invention to provide a MOS transistor structure which has concave channel, so that the effective channel length can be improved.

It is another object of the present invention to provide a method of fabricating concave channel MOS transistor, wherein both the gate electrode and source/drain areas of the MOS transistor are formed by self-aligned process steps, hence the use of photomasks can be reduced to a minimum.

In accordance with the objects of the present invention, a MOS transistor with concave channel and method of fabrication is provided. A barrier layer is formed overlying a silicon substrate, and patterned to expose a prospective gate electrode area of the silicon substrate. A field oxide layer is formed on the prospective gate electrode area of the silicon substrate. Then, the field oxide is removed to leave a concave area in the silicon substrate. Silicon dioxide sidewall spacers are formed apart on side walls of the barrier layer adjacent to edges of the concave area. A gate oxide layer is formed on the bottom of the concave area. A polysilicon layer is formed in conformity with the exposed surfaces of the barrier layer, the silicon dioxide sidewall spacers, and the gate oxide layer. A mask layer is formed overlying the polysilicon layer, and etched back to leave portion of the mask layer within the concave area. Next, portions of the polysilicon layer not covered by the mask layer are removed, so that the remained portion of the polysilicon layer and the gate oxide layer together construct a gate electrode, wherein the area under the gate electrode forms a concave channel. The mask layer and the barrier layer are removed respectively. First impurities are implanted into the silicon substrate not covered by the gate electrode and the silicon dioxide sidewall spacers to form heavily doped source/drain areas. After removing the silicon dioxide sidewall spacers, second impurities are implanted into the silicon substrate not covered by the gate electrode to form lightly doped source/drain areas completing the MOS transistor.

BRIEF DESCRIPTION OF THE DRAWINGS

The present invention will be more fully understood from the following detailed description of the preferred embodiment with reference to the accompanying drawings, wherein.

DETAILED DESCRIPTION OF THE PREFERRED EMBODIMENTS

Figure 1A:
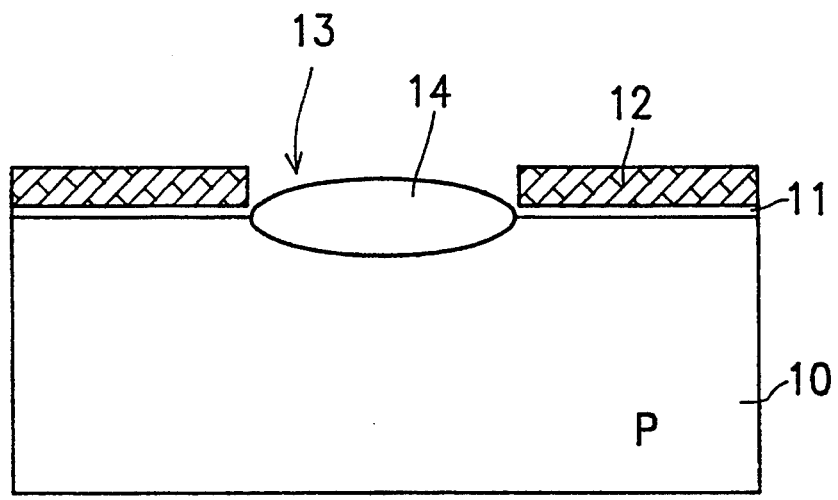
FIGS. 1A to 1D illustrate, in cross sectional views, the process steps of a prior art MOS transistor with a concave channel.
Figure 1B:
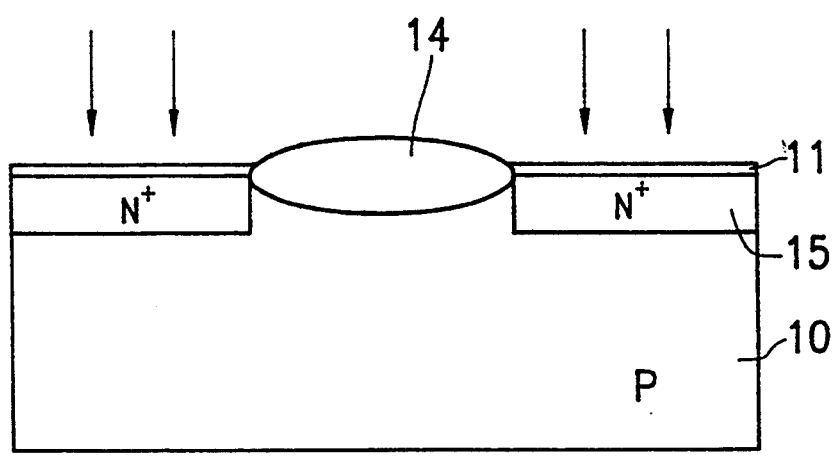
Figure 1C:
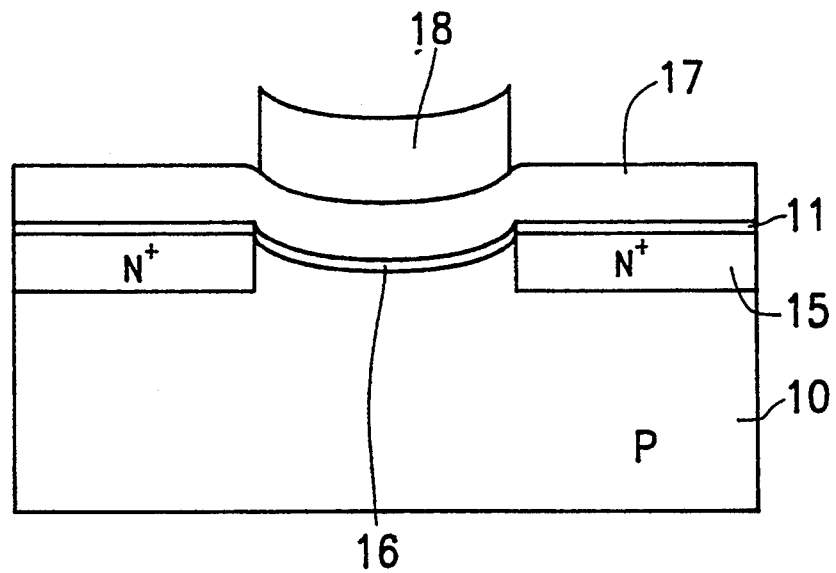
Figure 1D:
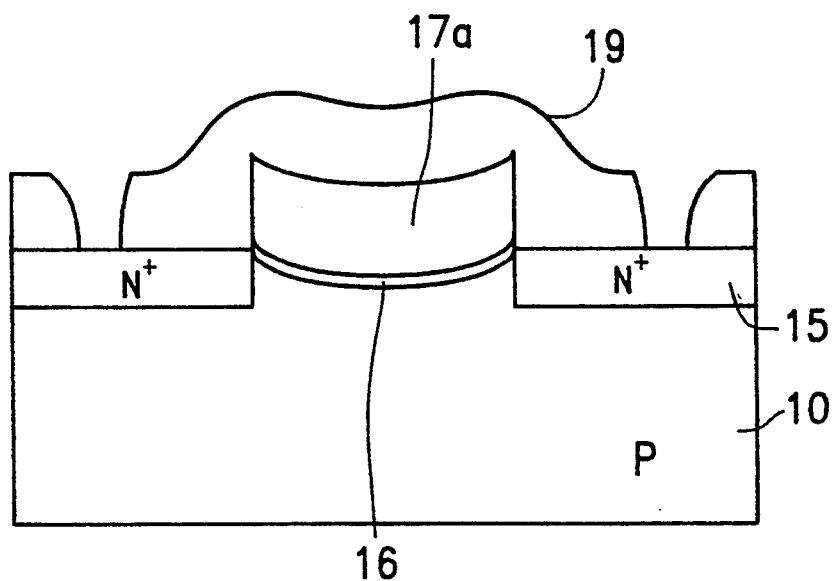
Figure 2A:
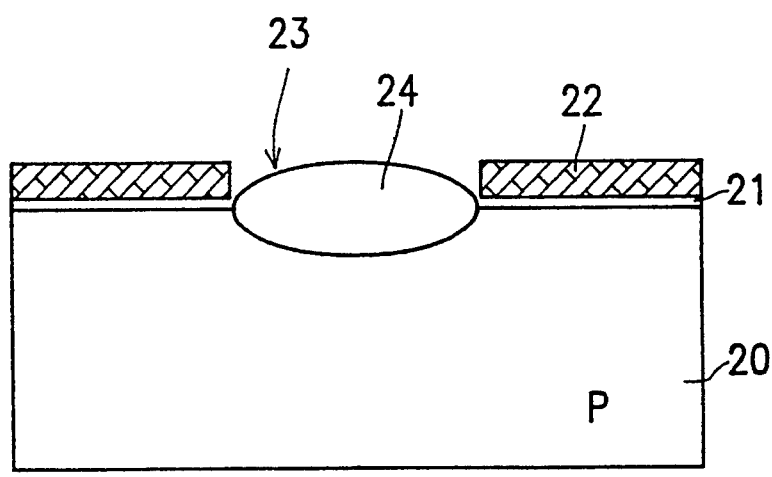
FIGS. 2A to 2G illustrate, in cross sectional views, the process steps of one preferred embodiment according to the present invention.
Figure 2B:
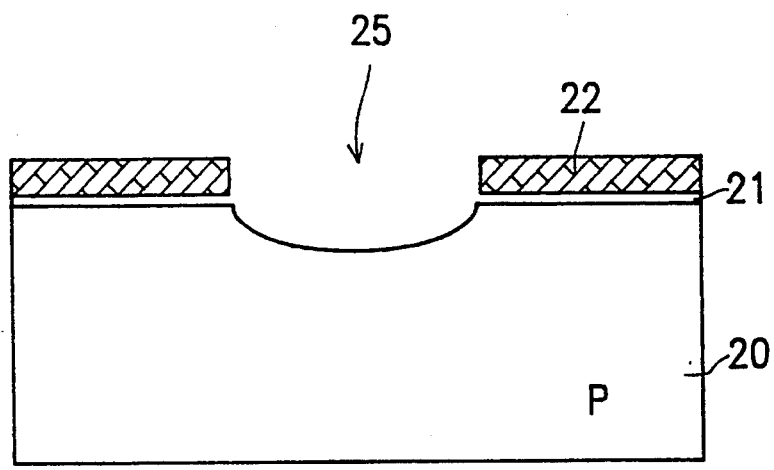

Referring to FIG. 2A, there is shown a semiconductor substrate, such as a P type silicon substrate 20. A conventional LOCOS procedure is performed as follows. A pad oxide layer 21 is formed on the silicon substrate 20 by thermal oxidation or CVD. A silicon nitride layer 22 is formed on the pad oxide layer 21 by CVD. Next, the silicon nitride layer 22 and the pad oxide layer 21 are patterned by conventional lithography and etching processes to form an opening 23 exposing a portion of the silicon substrate 20 where a gate electrode will be formed in subsequent processing. The portion of the silicon substrate 20 within the opening 24 is oxidized to form a field oxide layer 24. Then, the filed oxide layer 24 is etched away leaving a concave area 25 in the silicon substrate 20, as shown in FIG. 2B.

Figure 2C:
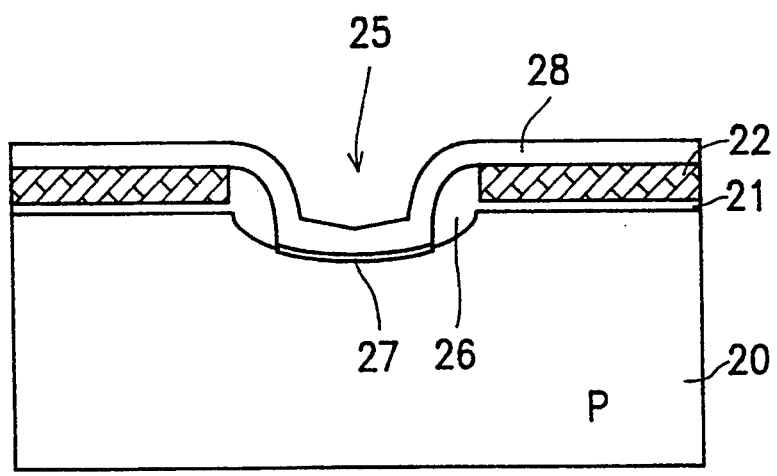

Referring to FIG. 2C, a silicon dioxide layer is deposited and etched back anisotropically by RIE without using a mask to form silicon dioxide sidewall spacers 26 apart on side walls of the silicon nitride layer 22 and the pad oxide layer 21. Next, a gate oxide layer 27 is formed on the bottom of the concave area 25 by thermal oxidation. A polysilicon layer 28 is formed, preferably by CVD, which conforms to the exposed surfaces of (i) the silicon nitride layer 22, (ii) the silicon dioxide sidewall spacers 26, and (iii) the gate oxide layer 27. The conductivity of the polysilicon layer 28 can be improved by an optional ion implantation process which introduces impurities, such as phosphorous ions, into the polysilicon layer 28.

Figure 2D:
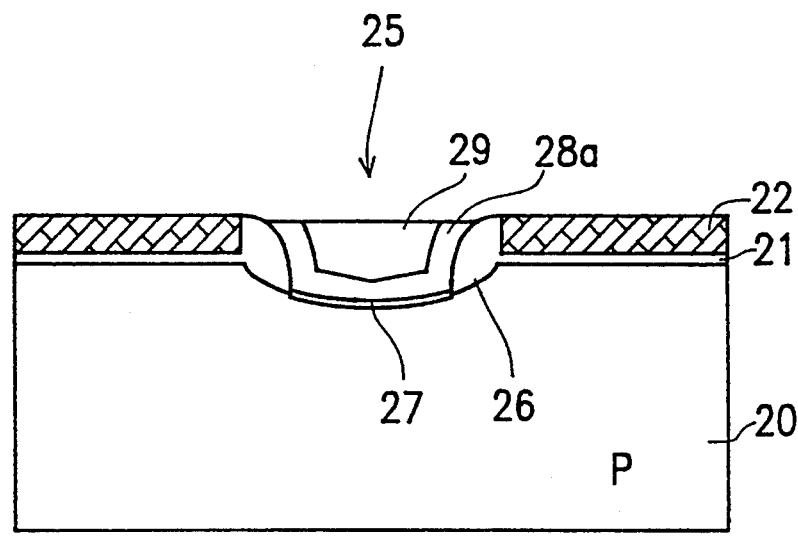

Referring to FIG. 2D, a photoresist layer 29 is coated on the surface of the polysilicon layer 28. The photoresist layer 29 is etched back by an anisotropic etching, such as reactive ion etching (RIE). Thus, only a portion of the photoresist layer 29 remain after the etch within a concave area 25 in the polysilicon layer 28 above the gate oxide layer 27. Portions of the polysilicon layer 28 not cover by the photoresist layer 29 are etched away by RIE, so that the remaining portion of the polysilicon layer 28 (designated as polysilicon gate layer 28a) and the gate oxide layer 27 together define a gate electrode of a MOS transistor. As can be seen, a concave channel 40 is formed at the area under the gate electrode.

Figure 2E:
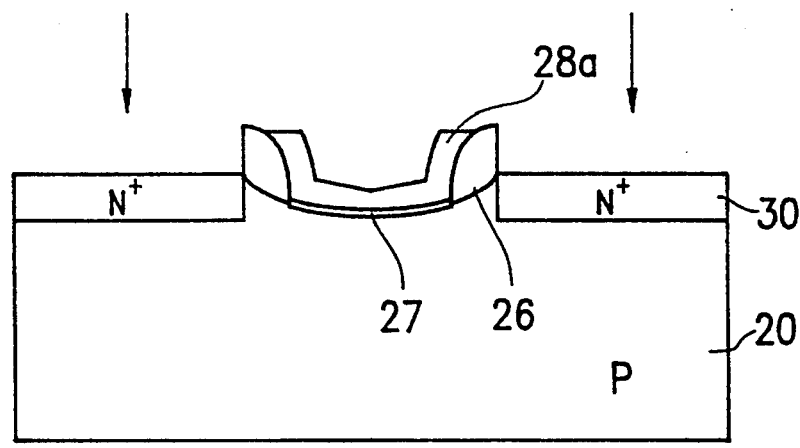

Referring to FIG. 2E, the photoresist layer 29, the silicon nitride layer 22, and the pad oxide layer 21 are removed by conventional etching processes, successively. N type impurities, such as arsenic ions, are implanted into the silicon substrate 20 to form heavily doped N+ source/drain areas 30 by using polysilicon gate layer 28a and silicon dioxide sidewall spacers 26 as masks. Wherein, for example, the implanting energy is about 80 KeV, and the dosage is about $5 \times 10^{15}$ atoms/cm$^2$.

Figure 2F:
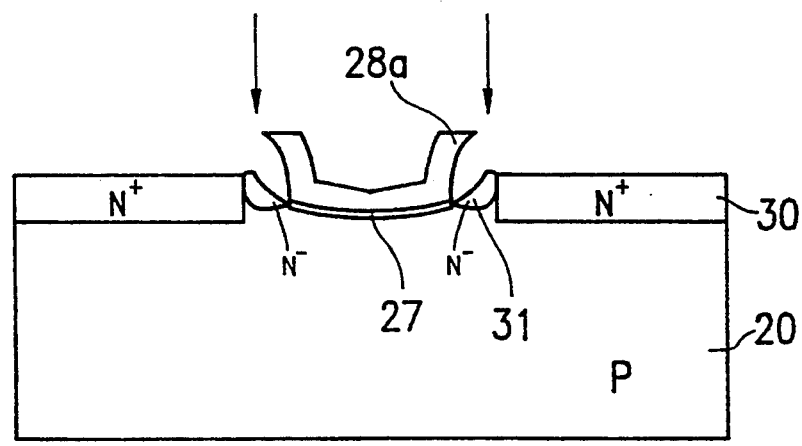
Figure 2G:
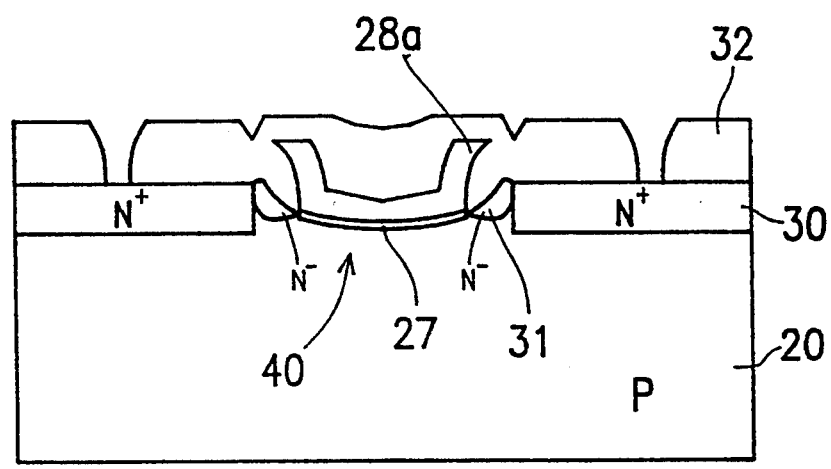

Referring to FIG. 2F, the silicon dioxide sidewall spacers 26 are etched away in a solution containing HF. Then, N type impurities, such as phosphorous ions, are implanted into the silicon substrate 20 to form lightly N− doped source/drain areas 31 by using polysilicon gate layer 28a as a mask. Preferably the implanting energy is about 50 KeV and the dosage is about $3 \times 10^{13}$ atoms/cm$^2$. Finally, an insulating layer with metal contact via, such as a BPSG layer 32, is formed on the silicon substrate 20, as shown in FIG. 2G, thereby completing the fabricating of a MOS transistor according to this invention.

Since the method according to the present invention can be used to form gate electrode and source/drain areas in a self-aligned manner, the use of photomasks can be reduced to a minimum. Indeed, according to the described process only one photomask is used. Hence, the efficiency of devices manufacture can be improved evidently.

While the invention has been particularly shown and described with reference to the preferred embodiments thereof, it will be understood by those skilled in the art that various changes in form and details may be made without departing from the spirit and scope of the invention. It therefore should he pointed out that the above description based on the described embodiment of the invention is only to describe the invention, not to limit the scope of the invention, which is defined in the claims below.

What is claimed is:

1. A method of fabricating a MOS transistor with a generally concave channel on a silicon substrate, comprising the steps of:
   forming a barrier layer overlying said silicon substrate, and patterning said barrier layer to expose a prospective gate electrode area of said silicon substrate;
   forming a field oxide layer on said prospective gate electrode area of said silicon substrate;
   removing said field oxide to leave a generally concave area in said silicon substrate;
   forming silicon dioxide sidewall spacers spaced apart at side walls of said barrier layer adjacent edges of said generally concave area;
   forming a gate oxide layer on a bottom of said generally concave area;
   forming a polysilicon layer conforming to exposed surfaces of said barrier layer, said silicon dioxide sidewall spacers, and said gate oxide layer;
   forming a mask layer overlying said polysilicon layer, and etching back to leave a portion of said mask layer within said concave area;
   removing portions of said polysilicon layer not covered by said mask layer, so that a remaining portion of said polysilicon layer and said gate oxide layer together define a gate electrode, wherein the area under said gate electrode forms a generally concave channel;
   removing said mask layer and said barrier layer;
   implanting first impurities into portions of said silicon substrate not covered by said gate electrode and said silicon dioxide sidewall spacers to form heavily doped source/drain areas;
   removing said silicon dioxide sidewall spacers; and
   implanting second impurities into portions of said silicon substrate not covered by said gate electrode to form lightly doped source/drain areas, thereby completing said MOS transistor.

2. The method of claim 1, wherein said barrier layer includes a pad oxide layer and a silicon nitride layer.

3. The method of claim 1, wherein said mask layer is a photoresist layer.

4. The method of claim 1, wherein said first impurities are arsenic ions with energy of about 80 KeV and dosage of about $5 \times 10^{15}$ atoms/cm$^2$.

5. The method of claim 1, wherein said second impurities are phosphorous ions with energy of about 50 KeV and dosage of about $3 \times 10^{13}$ atoms/cm$^2$.

6. The method of claim 1, wherein the length of said concave channel is determined by the thickness and width of said field oxide.

7. A MOS transistor formed in a semiconductor substrate comprising:
   (a) a generally concave surface formed in said substrate;
   (b) a gate oxide layer covering a portion of said generally concave surface, said gate oxide layer having an essentially uniform thickness;
   (c) a conductive gate electrode disposed over said gate oxide layer, said conductive gate electrode having a central portion in contact with said gate oxide layer and having outwardly disposed wing-shaped portions which extend over and are spaced from portions of said generally concave surface by a distance which is greater than the thickness of said gate oxide layer;
   (d) first doped regions with a first concentration of an impurity therein defined in said semiconductor substrate outwardly of said generally concave surface, said first doped regions defining source/drain areas of said MOS transistor; and
   (e) second doped regions with a second concentration of an impurity therein defined in said semiconductor substrate between said first doped regions and points where said conductive gate electrode contacts said gate oxide layer, said second concentration being less than said first concentration.

8. The MOS transistor of claim 7 where said wing-shaped portions overhang and are spaced from said second doped regions.

9. The MOS transistor of claim 7 wherein said gate electrode comprises polysilicon.

10. The MOS Transistor of claim 7 wherein said second dope regions have an impurity profile which decreases in a direction towards said points where said conductive gate electrode contacts said gate oxide layer.

* * * * *